US012784791B2

(12) United States Patent
Verma et al.

(10) Patent No.: US 12,784,791 B2
(45) Date of Patent: Nov. 3, 2026

(54) SRAM WITH FAST, CONTROLLED PEAK CURRENT, POWER EFFICIENT ARRAY RESET, AND DATA CORRUPTION MODES FOR SECURE APPLICATIONS

(71) Applicant: STMicroelectronics International N.V., Geneva (CH)

(72) Inventors: Praveen Kumar Verma, Greater Noida (IN); Promod Kumar, Greater Noida (IN); Harsh Rawat, Faridabad (IN)

(73) Assignee: STMicroelectronics International N.V., Geneva (CH)

( * ) Notice: Subject to any disclaimer, the term of this patent is extended or adjusted under 35 U.S.C. 154(b) by 118 days.

(21) Appl. No.: 18/929,840

(22) Filed: Oct. 29, 2024

(65) Prior Publication Data

US 2025/0054528 A1 Feb. 13, 2025

Related U.S. Application Data

(62) Division of application No. 17/853,026, filed on Jun. 29, 2022, now Pat. No. 12,159,689.

(51) Int. Cl.
*G11C 11/418* (2006.01)
*G11C 8/20* (2006.01)

(52) U.S. Cl.
CPC .............. *G11C 8/20* (2013.01); *G11C 11/418* (2013.01)

(58) Field of Classification Search
CPC ...................................................... G11C 11/41
See application file for complete search history.

(56) References Cited

U.S. PATENT DOCUMENTS

| | | | |
|---|---|---|---|
| 4,758,990 | A | 7/1988 | Uchida |
| 4,780,847 | A | 10/1988 | Ito |
| 4,928,266 | A | 5/1990 | Abbott et al. |
| 5,121,358 | A | 6/1992 | Slemmer et al. |

(Continued)

FOREIGN PATENT DOCUMENTS

| | | | |
|---|---|---|---|
| CN | 102074267 | A | 5/2011 |
| CN | 112687317 | A | 4/2021 |

(Continued)

OTHER PUBLICATIONS

Kang, Sangbeom, et al : "A 0.1μ 1.8v 256Mb 66MHz Synchronous Burst PRAM," ISSCC 2006, Session 7, Non-Volatile Memory, 7.5, 2006 IEEE.

(Continued)

*Primary Examiner* — Douglas King
(74) *Attorney, Agent, or Firm* — Crowe & Dunlevy LLC

(57) ABSTRACT

A method of corrupting contents of a memory array includes asserting a signal at a reset node to thereby cause starving of current supply to the memory array, and selecting bit lines and complementary bit lines associated with desired columns of the memory array that contain memory cells to have their contents corrupted. For each desired column, a logic state of its bit line and complementary bit line are forced to a same logic state. Each word line associated with desired rows of the memory array that contains memory cells to have their contents corrupted is simultaneously asserted, and then simultaneously deasserted to thereby place each memory cell to have its contents corrupted into a metastable state during a single clock cycle.

18 Claims, 7 Drawing Sheets

(56) References Cited

U.S. PATENT DOCUMENTS

| | | | | |
|---|---|---|---|---|
| 5,212,663 | A | 5/1993 | Leong | |
| 5,267,210 | A | 11/1993 | McClure et al. | |
| 5,285,420 | A | 2/1994 | Shibue | |
| 5,311,477 | A | 5/1994 | Rastegar | |
| 5,373,466 | A | 12/1994 | Landeta et al. | |
| 5,646,890 | A | 7/1997 | Lee et al. | |
| 5,798,976 | A | 8/1998 | Arimoto | |
| 5,940,606 | A * | 8/1999 | Ghia | G11C 7/22 711/100 |
| 5,995,429 | A | 11/1999 | Kojima et al. | |
| 5,999,471 | A | 12/1999 | Choi | |
| 6,721,223 | B2 | 4/2004 | Matsumoto et al. | |
| 6,724,648 | B2 | 4/2004 | Khellah et al. | |
| 6,963,499 | B2 | 11/2005 | Rimondi et al. | |
| 7,173,845 | B2 | 2/2007 | Coker | |
| 7,224,600 | B2 | 5/2007 | McClure | |
| 7,333,380 | B2 | 2/2008 | Schoellkopf | |
| 7,385,850 | B2 | 6/2008 | Jeong et al. | |
| 7,463,536 | B2 | 12/2008 | Scheuerlein et al. | |
| 7,924,630 | B2 | 4/2011 | Carman | |
| 8,189,423 | B2 | 5/2012 | Keeth et al. | |
| 8,588,024 | B2 | 11/2013 | Patel et al. | |
| 9,190,141 | B2 | 11/2015 | Chai et al. | |
| 9,400,890 | B2 | 7/2016 | Bostley, III et al. | |
| 9,442,663 | B2 | 9/2016 | Yan et al. | |
| 9,570,164 | B2 | 2/2017 | Haukness | |
| 10,229,746 | B2 | 3/2019 | Chung | |
| 10,909,051 | B2 | 2/2021 | Canepa | |
| 2003/0189849 | A1 | 10/2003 | Khellah et al. | |
| 2003/0231538 | A1 | 12/2003 | Rimondi et al. | |
| 2006/0233015 | A1 | 10/2006 | Schoellkopf | |
| 2010/0232250 | A1 | 9/2010 | Bull et al. | |
| 2012/0230143 | A1 | 9/2012 | Patel et al. | |
| 2015/0213881 | A1 * | 7/2015 | Rai | G11C 11/419 365/154 |
| 2018/0314781 | A1 * | 11/2018 | Zhou | G06F 30/367 |
| 2019/0392179 | A1 | 12/2019 | Lu | |
| 2020/0014547 | A1 | 1/2020 | Lu et al. | |
| 2020/0327928 | A1 | 10/2020 | Kim et al. | |
| 2021/0057022 | A1 | 2/2021 | Jenkinson et al. | |
| 2022/0199153 | A1 | 6/2022 | Nagata | |
| 2023/0186981 | A1 | 6/2023 | Nagata et al. | |

FOREIGN PATENT DOCUMENTS

| | | | |
|---|---|---|---|
| EP | 1239487 | A1 | 9/2002 |
| FR | 1344608 | A | 11/1963 |
| JP | H0778479 | A | 3/1995 |
| JP | 20050251244 | A | 9/2005 |

OTHER PUBLICATIONS

Khan, Mohammad Nasim Imtiaz: “Assuring Security and Privacy of Emerging Non-Volatile Memories,” A Dissertation in Electrical Engineering, The Pennsylvania State University, The Graduate School, Dec. 2019.

Meadows, Brett, et al: “On-Chip Randomization for Memory Protection Against Hardware Supply Chain Attacks to DRAM,” 2020 Symposium on Security and Privacy Workshops (SPW), 2020.

* cited by examiner

SRAM WITH FAST, CONTROLLED PEAK CURRENT, POWER EFFICIENT ARRAY RESET, AND DATA CORRUPTION MODES FOR SECURE APPLICATIONS

RELATED APPLICATION

This application is a division of United States Application for patent Ser. No. 17/853,026, filed on Jun. 29, 2022, which claims priority to United States Provisional Application for Patent No. 63/221,067, filed on Jul. 13, 2021, the contents of which are incorporated by reference in their entireties.

TECHNICAL FIELD

This disclosure relates to the field of static random access memories (SRAMs), and in particular, to techniques for performing fast resets and fast content corruptions of SRAMs while reducing power consumption for those processes.

BACKGROUND

Static random access memory (SRAM) is used in many electronic devices in the modern world. Certain applications that utilize SRAM memory, such as time-of-flight (ToF) ranging and Light Detection and Ranging (LiDAR) applications, involve the frequent "reset" of the SRAM memory, which is to say the writing of the same logical value (such as a logic 0 as default, or as an alternative a logic 1, or a predefined pattern of logic 1s and logic 0s such as a checker board) to all memory cells of at least a portion of the SRAM.

Reference is now made to FIG. 1A which shows a block diagram of a memory circuit 10 for use in HistoRam (memory used in the building of histograms for ranging applications). The circuit 10 includes an array 12 of memory cells C arranged in rows and columns. The array 12 has a size of m×n, with m being the number of columns and n being the number of rows. The memory cells in each row are controlled by a word line from among word lines 14[0], . . . , 14[*n*−1]. The memory cells in each column are connected to a bit line/complementary bit line pair from among pairs 16[0], . . . , 16[*m*−1]. A row decoder circuit 18*b* receives a row address that is predecoded from an address and decodes the bits of the row address to select and actuate one of the word lines 14[0], . . . , 14[*n*−1]. A column decoder circuit 18*a* receives a column address that is predecoded from the address and decodes the bits of the column address to select a plurality of the bit lines 16[0], . . . , 16[*m*−1]. In read mode, data stored in the memory cells which are located at the intersections of the one of the word lines 14[0], . . . , 14[*n*−1] and the plurality of bit lines 16[0], . . . , 16[*m*−1] selected by the address is read out to the data input/output lines 20. In write mode, data on the data input/output lines 20 is written to the memory cells which are located at the intersections of the one of the word lines 14[0], . . . , 14[*n*−1] and the plurality of bit lines 16[0], . . . , 16[*m*−1] selected by the address.

The write operation will be discussed more in detail, since this disclosure focuses on the write operation. In particular, note that at the end of every memory access operation, the precharge circuit 24 precharges the bit line pairs 16[0], . . . , 16[*m*−1] to a voltage that is represents a logic 1. Therefore, at the beginning of a write operation, the selected bit line pairs 16[0], . . . , 16[*m*−1] are already precharged. Thus, the precharge voltage applied by the precharge circuit 24 to the selected bit line pairs 16[0], . . . , 16[*m*−1] is released, allowing the selected bit line pairs 16[0], . . . , 16[*m*−1] to float. Then, the selected word line 14[0], . . . , 14[*n*−1] is selected by the row decoder circuitry 18*b* asserting the associated word line 14[0], . . . , 14[*n*−1], and the write driver 22 forces the selected memory cells to the desired logic value. To complete the write operation, the word line is deselected and precharge of the selected bit line pairs 16[0], . . . , 16[*m*−1] is reinstated, readying the associated memory cells for the next memory access operation, whether it be a write operation or a read operation.

Conventionally, memory cells of the array 12 are selected one word at a time for a write operation. Conventionally, to reset a portion or all of the memory cells of the array 12, a write operation is performed for each selected word to write logic zeroes, for example, into the memory cells of that word. Conventionally, one clock cycle is used for each write operation to be performed. Therefore, the number of clock cycles used to reset a given number of words is equal to the given number of words (e.g., if ten words are to be reset, ten clock cycles are used to write logic zeroes to the memory cells of each word). While the write cycle times for modern SRAM memory are relatively short, for certain applications such as ToF and LiDAR, it is desired for large blocks of SRAM to be reset as quickly as possible, and even modern SRAM memory cannot perform this as quickly as desired due to the large number of clock cycles that may be involved.

Still further, note that each write operation performed (and one is performed per word to be reset) involves the charging/discharging of the ones of that bit line pair followed by a precharge of that bit line pair, consuming power for each memory cell of each word to be reset. Even further, as can be observed in FIG. 1A, it is common for a separate reset data input "D" to be present in HistoRam (or conventional SRAM with an existing D input) so that the selected reset value (logic 0 or logic 1) can be directly read for writing to the words to be reset, resulting in area consumption for the reset data input and the associated routing.

It would be desirable to be able to reset multiple words of the array 12 of memory cells in a single clock cycle. For example, it might be desirable to be able to reset multiple words within a single column of the array 12 of memory cells in a single clock cycle. Unfortunately, this is not possible with existing designs.

For example, a portion of one row of memory cells of the array 12 is shown in FIG. 1B. This is row 0 of the array 12, and here, both the bit line BL[0] and complementary bit line BLN[0] are shown. Row 0 is illustrated as containing two memory cells, C[0,0] and C[0,1].

Memory cell C[0,0] is a standard six transistor memory cell known to those of skill in the art, formed by a pair of cross coupled CMOS inverters, the first inverter formed by PMOS transistor MP1 and NMOS transistor MN1, the second inverter formed by PMOS transistor MP2 and NMOS transistor MN2. The output of the first inverter is at node BLTI[0,0], and the input of the first inverter is at node BLFI[0,0]; the output of the second inverter is at node BLFI[0,0] and the input of the second inverter is at node BLTI[0,0]. A pass gate NMOS transistor MN3 connects the output of the first inverter to the bit line BL[0], and a pass gate NMOS transistor MN4 connects the output of the second inverter to the complementary bit line BLN[0].

Memory cell C[0,1] is a standard six transistor memory cell known to those of skill in the art, formed by a pair of cross coupled CMOS inverters, the first inverter formed by PMOS transistor MP5 and NMOS transistor MN9, the second inverter formed by PMOS transistor MP6 and NMOS transistor MN10. The output of the first inverter is at node BLTI[0,1], and the input of the first inverter is at node BLFI[0,1]; the output of the second inverter is at node BLFI[0,1] and the input of the second inverter is at node BLTI[0,1]. A pass gate NMOS transistor MN11 connects the output of the first inverter to the bit line BL[0], and a pass gate NMOS transistor MN12 connects the output of the second inverter to the complementary bit line BLN[0].

In this example, assume that the cell C[0,0] is storing a logic 1-node BLTI[0,0] would be at a logic high and node BLFI[0,0] would be at a logic low. In order to write a logic 0 to cell C[0,0] when the word line 14[0] is asserted, the write driver 22 must sink sufficient current from node BLTI[0,0] to pull node BLTI[0,0] to a logic low. Node BLTI[0,0] being pulled to a logic low turns on transistor MP2 and turns off transistor MN2, causing node BLFI[0,0] to change state to a logic high, which then results in transistor MP1 turning off and transistor MN1 turning on to thereby maintain BLTI[0,0] at a logic 0 so that the word line 14[0] can be deasserted to complete the write operation to memory cell C[0,0]. In order to sink sufficient current from node BLTI[0,0] to pull that node to a logic low, the write driver 22 must be able to overcome the current sourced to node VDD.

When resetting memory cell C[0,0], the write driver 22 has sufficient current sinking capability to overcome the current sourced to VDD (e.g., the write driver 22 can sink more current than is sourced to VDD).

To reset memory cells C[0,0] and C[0,1] in a single clock cycle however (assuming both memory cells are storing a logic 1) requires the simultaneous assertion of word lines 14[0] and 14[1], and the ability for the write driver 22 to sink sufficient current from both node BLTI[0,0] and BLTI[0,1] simultaneously to pull those nodes to a logic low. Thus, as the number of memory cells in a single column to be simultaneously reset grows, the current sinking requirement imposed on the write driver 22 grows, and the write driver 22 may not have that capability.

As a consequence, further development into circuitry and techniques for operating said circuitry to provide for a fast, low-power consumption memory reset is needed.

In addition, in some instances, such as the detection of an attempted unauthorized access of the memory, it may be desirable for the contents of the memory to have the capability to be quickly corrupted and therefore rendered of no use in case those contents are accessed. However, for the same reasons that resetting multiple memory cells within a single column imposes higher current sinking requirements on the write driver 22, known operations for purposely corrupting multiple memory cells within a single column imposes higher current sinking requirements on the write driver 22, and the write driver 22 may not have that capability. Therefore, further development into circuitry and techniques for operating said memory to provide for a fast, lower-power consumption and robust memory corruption operation is needed.

SUMMARY

A method of corrupting contents of a memory array includes asserting a signal at a reset node to cause starving of current supply to the memory array; selecting bit lines and complementary bit lines associated with desired columns of the memory array that contain memory cells to have their contents corrupted; for each desired column, forcing a logic state of its bit line and complementary bit line to a same logic state; and simultaneously asserting each word line associated with desired rows of the memory array that contains memory cells to have their contents corrupted, and then simultaneously deasserting those word lines to place each memory cell to have its contents corrupted into a metastable state during a single clock cycle.

The method may include generating a virtual supply voltage from a power supply voltage by coupling a power supply voltage node to a virtual supply voltage node using multiple transistors to generate the virtual supply voltage at the virtual supply voltage node, and powering the memory array using the virtual supply voltage. The asserting of the signal at the reset node may cause starving of the current supply to the memory array by turning off one of the multiple transistors being used to couple the power supply voltage node to the virtual supply voltage node. The one transistor turned off to starve the current supply to the memory array may be a largest of the multiple transistors.

The method may involve corrupting all memory cells of the memory array, where selecting includes selecting all bit lines and all complementary bit lines. For each column, forcing may include forcing a logic state of its bit line and complementary bit line to a same logic state, and simultaneously asserting may include simultaneously asserting each word line, then simultaneously deasserting each word line. For each column, forcing may include forcing a logic state of its bit line and complementary bit line to a given logic state.

The method may involve less than all columns containing memory cells that are desired to have their contents corrupted, or less than all rows containing memory cells that are desired to have their contents corrupted.

The selecting, forcing, and asserting steps may be performed in response to a clock pulse of an internal clock signal, with the deasserting of the word lines being performed at an end of the clock pulse. The signal at the reset node may be a complement of an internal clock signal.

Placing each memory cell into a metastable state may include causing voltage levels at first nodes of the memory cells to be pulled to near but not fully at a first logic level, and causing voltage levels at second nodes of the memory cells to rise to slightly above a second logic level. After placing each memory cell into a metastable state, a final logic state of each memory cell may be randomly determined based on which of its cross coupled inverters prevails in resolution of the metastable state.

Forcing the logic state of bit lines and complementary bit lines to a same logic state may include, for a first subset of the desired columns, forcing both the bit line and complementary bit line to a logic low state, and for a second subset of the desired columns, forcing both the bit line and complementary bit line to a logic high state.

A static random access memory (SRAM) device includes a virtual power supply circuit configured to generate a virtual power supply voltage; a memory array powered between the virtual power supply voltage and a reference voltage, the memory array with memory cells and organized into rows and columns, with each row having a word line and each column having a bit line and complementary bit line; a row decoder configured to selectively assert word lines of desired rows; a column decoder configured to select desired columns; where the virtual power supply circuit reduces its current output to starve the memory array, in response to an internal clock signal pulse; and column driving circuitry configured to drive the bit lines and complementary bit lines of the desired columns to a same logic state in response to being clocked by the internal clock signal pulse and assertion of a latched reset signal. The row decoder simultaneously asserts the word lines of each desired row in response to being clocked by the internal clock signal pulse and based upon the latched reset signal, and simultaneously deasserts the word lines of each desired row in response to an end of the internal clock signal pulse, placing the memory cells belonging to the desired rows and desired columns into a metastable state.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

A. Fast Reset of Memory Cells to Logic 0

Figure 1A:
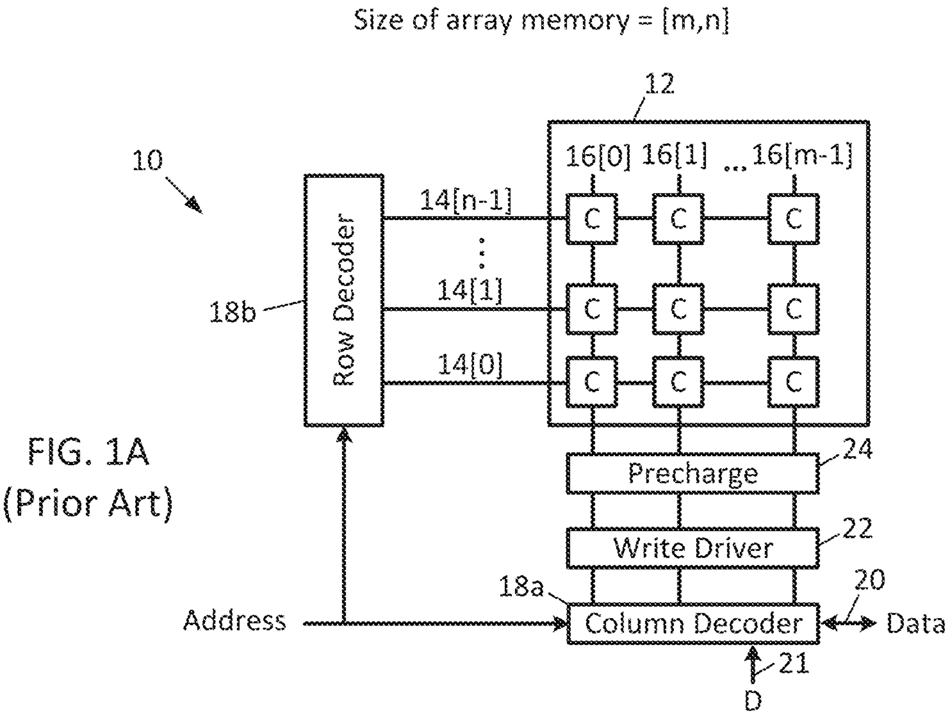
FIG. 1A (Prior Art)
FIG. 1A is a block diagram of a conventional SRAM device.
Figure 1B:
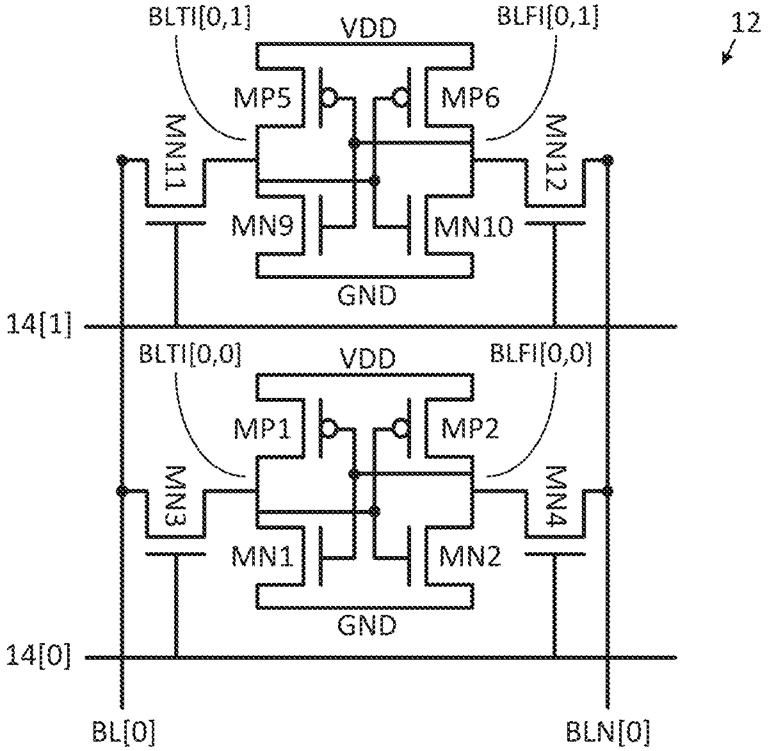
FIG. 1B (Prior Art)
FIG. 1B is a schematic diagram of a single column of the conventional SRAM device of FIG. 1A.
Figure 2:
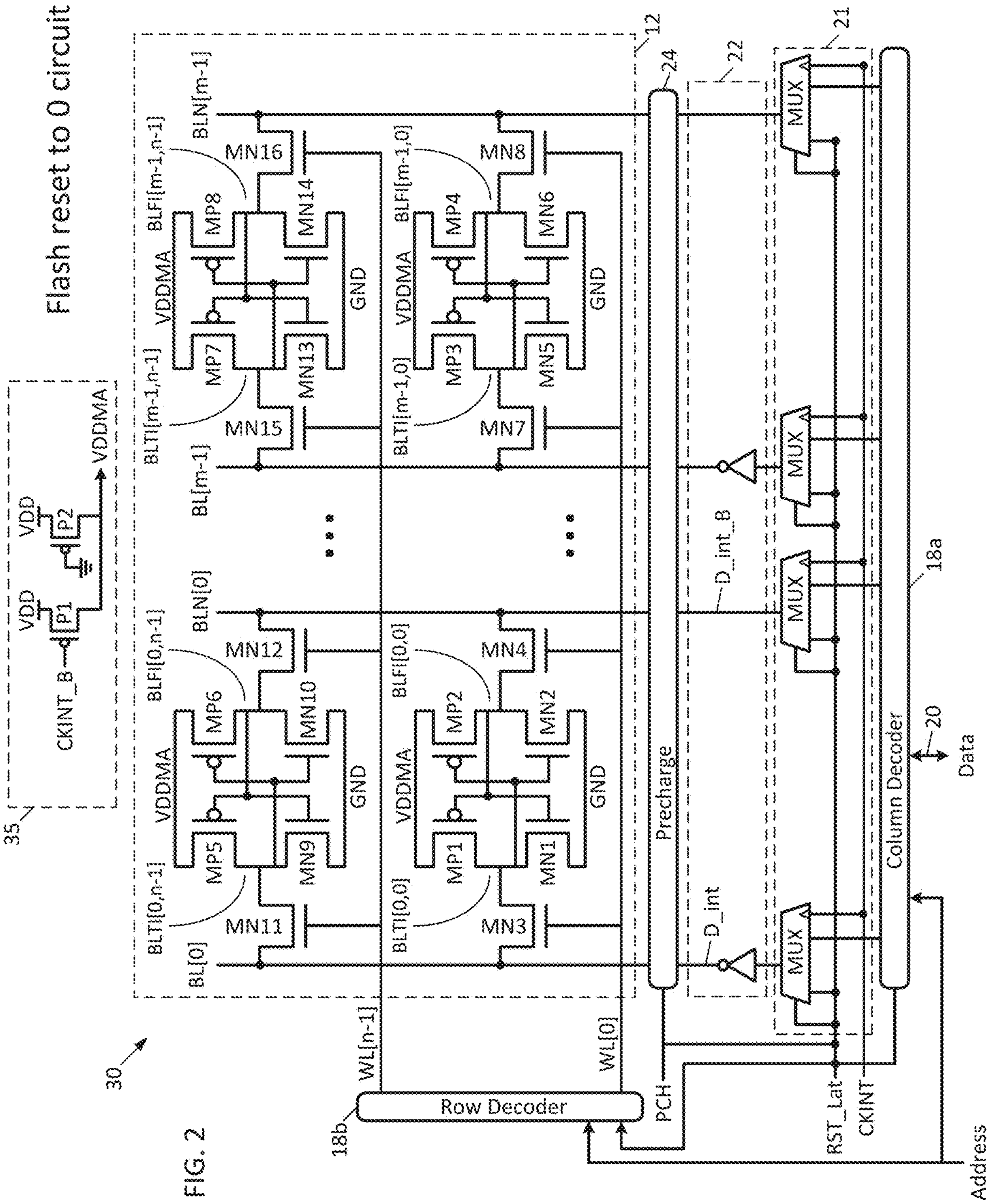
FIG. 2 is a schematic block diagram of a SRAM device disclosed herein which is capable of performing a fast and low-power reset of all rows and all columns of memory cells simultaneously to a value of 0, the SRAM device having the capability of limiting the current drawn during the reset operation.

Now described with initial reference to FIG. 2 is an SRAM device 30 on which a fast memory reset may be performed simultaneously on all memory cells at once, or may be performed simultaneously on all desired rows and desired columns of memory cells at once, while limiting the power drawn during the reset so as to avoid errors caused from a potential drop in supply voltage. Such errors could include loss of data by memory cells not being reset, other components of the SRAM device 30 malfunctioning, etc.

The SRAM device 30 includes a supply voltage generation circuit 35 for generating a virtual supply voltage at a virtual supply voltage node VDDMA from a primary supply voltage node VDD, and for limiting the current sourced to the virtual supply voltage node VDDMA when a complement CKINT_B of an internal clock signal CKINT is asserted.

As shown, the supply voltage generation circuit 35 includes PMOS transistors P1 and P2 each coupled between the primary supply voltage VDD and the virtual supply voltage node VDDMA. PMOS transistor P1 may be larger than transistor P2, and may be capable of sourcing a greater amount of current. The PMOS transistor P2 has its gate tied to ground, such that it is always on when the SRAM device 30 is on. The PMOS transistor P1 has its gate configured to receive the complement CKINT_B of the internal clock signal, such that when CKINT_B is not asserted, the PMOS transistor P1 is on. However, when CKINT_B is asserted, the PMOS transistor P1 turns off, halving (or more than halving) the total current that may be supplied to the virtual supply voltage node VDDMA, this having the effect of starving the cells of the memory array 12 changing state (i.e., being reset).

Note that in the example shown, there is one supply voltage generation circuit 35 for the memory array 12, but in some instances, there may be one supply voltage generation circuit 35 per column (with each supply voltage generation circuit being as described above, and generating the virtual supply voltage node VDDMA for its respective column), or there may be one supply voltage generation circuit 35 per block or sub-array of the array 12. In some instances, there may even be one supply voltage generation circuit 35 per memory cell.

Turning now to the other details of the SRAM device 30, the SRAM device 30 includes a memory array 12. The memory array 12 has a size of m×n, with m being the number of columns and n being the number of rows. At each intersection of a column and row, a memory cell is present.

For example, the memory cell C[0,0] located at a position in the memory array 12 wherein the 0-th pair of bit lines and 0-th word line cross is comprised of cross coupled inverters (the first inverter being a CMOS inverter formed by PMOS MP1 and NMOS MN1, the second inverter being a CMOS inverter formed by PMOS MP2 and NMOS MN2), with a transfer gate NMOS MN3 coupled between a node BLTI[0, 0] at the drains of MP1 and MN1 and the bit line BL[0], and a transfer gate NMOS MN4 coupled between a node BLFI [0,0] at the drains of MP2 and MN2 and the complementary bit line BLN[0]. This memory cell C[0,0] is powered between the virtual supply voltage node VDDMA and ground GND.

Similarly, the memory cell C[m−1,0] located at a position in the memory array 12 wherein the (m−1)-th pair of bit lines and 0-th word line cross is comprised of cross coupled inverters (the first inverter being a CMOS inverter formed by PMOS MP3 and NMOS MN5, the second inverter being a CMOS inverter formed by PMOS MP4 and NMOS MN6), with a transfer gate NMOS MN7 coupled between a node BLTI[m−1,0] at the drains of MP3 and MN5 and the bit line BL[m−1], and a transfer gate NMOS MN8 coupled between a node BLFI[m−1,0] at the drains of MP2 and MN2 and the complementary bit line BLN[m−1]. This memory cell C[m−1,0] is powered between the virtual supply voltage node VDDMA and ground GND.

The memory cell C[0,n−1] located at a position in the memory array 12 wherein the 0-th pair of bit lines and (n−1)-th word line cross is comprised of cross coupled inverters (the first inverter being a CMOS inverter formed by PMOS MP5 and NMOS MN9, the second inverter being a CMOS inverter formed by PMOS MP6 and NMOS MN10), with a transfer gate NMOS MN11 coupled between a node BLTI[0,n−1] at the drains of MP5 and MN9 and the bit line BL[0], and a transfer gate NMOS MN12 coupled between a node BLFI[0,n−1] at the drains of MP6 and MN10 and the complementary bit line BLN[0]. This memory cell C[0,n−1] is powered between the virtual supply voltage node VDDMA and ground GND.

The memory cell C[m−1,n−1] located at a position in the memory array 12 wherein the (m−1)-th pair of bit lines and (n−1)-th word line cross is comprised of cross coupled inverters (the first inverter being a CMOS inverter formed by PMOS MP7 and NMOS MN13, the second inverter being a CMOS inverter formed by PMOS MP8 and NMOS MN14), with a transfer gate NMOS MN15 coupled between a node BLTI[m−1,n−1] at the drains of MP7 and MN13 and the bit line BL [m−1], and a transfer gate NMOS MN16 coupled between a node BLFI[m−1,n−1] at the drains of MP8 and MN14 and the complementary bit line BLN[m−1]. This memory cell C[m−1,n−1] is powered between the virtual supply voltage node VDDMA and ground GND.

The memory cells in each row are controlled by a word line from among word lines WL[0], . . . , WL[n−1]. Selection of one or more rows is accomplished by the row decoder **18*b* asserting the associated one or ones of the word lines WL[0], . . . , WL[n−1]. Selection of one or more columns is accomplished by the column decoder 18*a*** performing said selection.

Precharge circuitry 24 is coupled to each bit line and complementary bit line pair BL[0], BLN[0], . . . , BL[m−1], BLN[m−1], and is controlled by a precharge control signal PCH.

Write driver circuitry 22 is coupled between multiplexing circuitry 21 and the precharge circuitry 24. The write driver circuitry 22 includes, for each bit line BL[0], . . . , BL[m−1] an inverter having an input coupled to the multiplexing circuitry 21 and an output associated with the precharge circuitry 24.

The multiplexing circuitry 21 includes, for each bit line BL[0], . . . , BL[m−1] and complementary bit line BLN[0], . . . , BLN[m−1], a multiplexer (MUX) having a first data input coupled to the column decoder **18*a*, a second data input coupled to a latched version RST_Lat of a reset signal RST, a selection input (that determines which data input it passed as output) coupled to RST_Lat, and a clock input coupled to receive the internal clock signal CKINT. Notice here that RST_Lat is provided as an input to the column decoder 18*a* to permit the selection of desired columns, and that RST_Lat is coupled to the precharge circuitry 24 such that assertion of RST_Lat can deactivate the precharge circuitry 24. Also notice that RST_Lat is provided as an input to the row decoder 18*b***, and is used to permit the selection of all rows, or desired ones of the rows.

Figure 3:
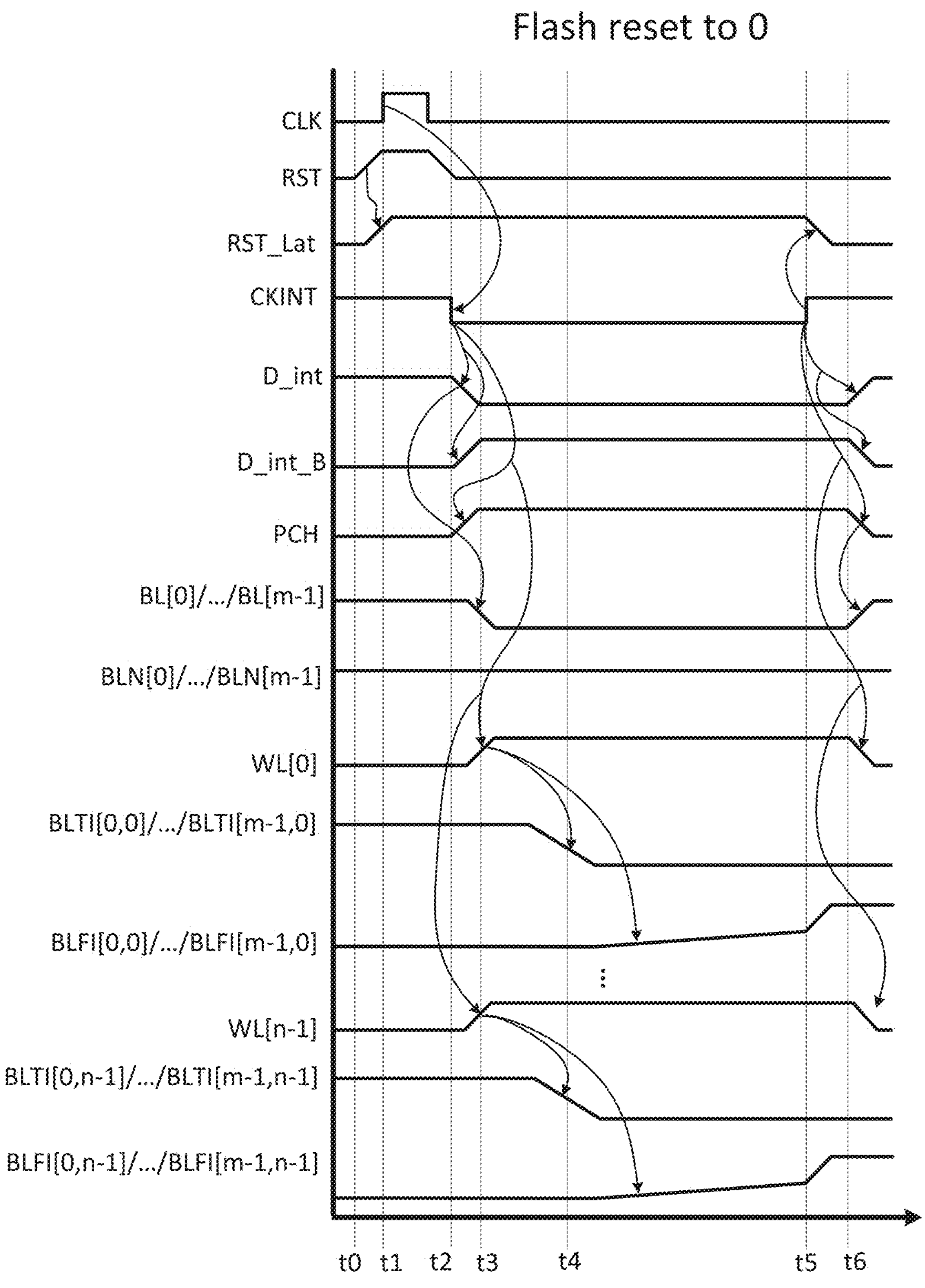
FIG. 3 is a timing diagram of the SRAM device of FIG. 2 when resetting all rows and all columns of memory cells to a default value of 0.

Operation is now described with additional reference to FIG. 3. In order to perform a reset of the SRAM array 30, a reset signal RST (such as may be received via a pad or pin) is asserted, illustrated at time t0. This reset signal RST is latched by time t1 to generate a latched version RST_LAT of the reset signal RST. At time t2, an internal clock signal CKINT generated based upon the external clock signal CLK falls to a logic low. CKINT falling to a logic low means that its complement, CKINT_B, rises to a logic high, turning off transistor P1, thereby limiting the supply of current to the memory array 12 to only that current which can be provided by transistor P2, effectively starving the inverters of the cells of the memory array coupled to the virtual supply voltage node VDDMA.

This operation of current starvation is critical for enabling the reset (e.g., to a logic 0) of all desired rows and all desired columns of the memory array 12 to occur simultaneously.

Assume, for example, that all memory cells of a desired column of the memory array 12 to be reset currently store a logic 1, and are to be reset to a logic 0.

Refer, for example, to the cell C[0,0] of the memory array 12, and assume that the cell C[0,0] is storing a logic 1-node BLTI[0,0] (the output of the inverter formed by transistors MP1, MN1) would be at a logic high and node BLFI[0,0] (the output of the inverter formed by transistors MP2, MN2) would be at a logic low. In order to write a logic 0 to cell C[0,0] when the word line WL[0] is asserted, the write driver (e.g., the illustrated inverter) for bit line BL[0] must sink sufficient current from node BLTI[0,0] to pull node BLTI[0,0] to a logic low. Node BLTI[0,0] being pulled to a logic low turns on transistor MP2 and turns off transistor MN2, causing node BLFI[0,0] to change state to a logic high, which then results in transistor MP1 turning off and transistor MN1 turning on to thereby maintain BLTI[0,0] at a logic 0 so that the word line WL[0] can be deasserted to complete the write operation to memory cell C[0,0]. In order to sink sufficient current from node BLTI[0,0] to pull that node to a logic low, the write driver for bit line BL[0] must be able to overcome the current sourced to node VDDMA.

When resetting one row, the write driver for the bit line BL[0] has sufficient current sinking capability to overcome the current sourced to VDDMA (e.g., the write driver can sink more current than is sourced to VDDMA). However, now consider the case of the reset of two rows of the memory array 12.

For this example, assume that it is desired to reset column 0, assume that column 0 contains memory cells C[0,0] and C[0, n−1] as illustrated, and assume that the memory cells C[0,0] and C[0, n−1] are both storing a logic 1-nodes BLTI[0,0] and BLTI[0, n−1] are at a logic high and nodes BLFI[0,0] and BLFI[0, n−1] are at a logic low. To reset memory cells C[0,0] and C[0, n−1] to a logic 0 simultaneously, word lines WL[0] and WL[n−1] are asserted simultaneously. The write driver for bit line BL[0] must then be capable of sinking sufficient current from both node BLTI [0,0] and node BLTI[0, n−1] simultaneously to pull those nodes to a logic low—the current sinking requirement imposed on the write driver for bit line BL[0] has doubled.

It is evident therefore that as the number of rows to be simultaneously reset grows, the current sinking requirement imposed on the write drivers grows accordingly. For this reason, prior art devices are unable to simultaneously reset large numbers of rows of memory cells simultaneously.

However, to enable the SRAM device 30 to reset a large number of rows, or even reset all rows of the memory array 12, the supply voltage generation circuit 35 is employed. When CKINT falls to a logic low at time t2, the transistor P1 turns off, leaving the transistor P2 as being the sole supplier of current to the virtual supply voltage node VDDMA. This therefore reduces the total amount of current sourced to the virtual supply voltage node VDDMA, reducing the current sinking requirement imposed on the write drivers in order to reset the memory cells of a given number of rows.

Also at time t2, as a result of CKINT falling to a logic low, precharge is released, and the multiplexers of the multiplexing circuitry 21 are clocked. As a result of the clocking of the multiplexers, the multiplexers select which data input is to be passed to their outputs, based upon the signal at their selection input. The multiplexers are arranged such that RST_Lat being at a logic high selects the data input of the multiplexers that is coupled to RST_Lat. Therefore, by time t3, precharge is off, and the multiplexers are each outputting a logic high (since RST_Lat is high). Due to the inverters coupled to the multiplexers and associated with the precharge circuitry 24 for the bit lines BL[0], . . . , BL[m−1], this results in the signal D_int forced onto the bit lines BL[0], . . . , BL[m−1] falling to a logic low by time t3, which in turn causes the bit lines BL[0], . . . , BL[m−1] to fall to a logic low. Due to the lack of inverters coupled to the multiplexers and associated with the precharge circuitry 24 for the bit lines BL[0], . . . , BL[m−1], the signal D_int_B rises to a logic high by time t3, maintaining the complementary bit lines BLN[0], . . . , BLN[m−1] at a logic high.

Also as a result of CKINT falling to a logic low, all of the word lines WL[0], . . . , WL[n−1] are asserted, turning on the pass gate transistors within each bit cell (e.g., for the illustrated bit cells, MN3, MN4 within C[0,0]; MN7,MN8 within C[m−1,0]; M11,M12 within C[0,n−1]; and M15, M15 within C[m−1,n−1]). Since the bit lines BL[0], . . . , BL[m−1] are at a logic low and the complementary bit lines BLN[0], . . . , BLN[m−1] are at a logic high at this point, the word lines WL[0], . . . , WL[n−1] being asserted causes a logic 0 to be written to the bit cells. Thus, by time t4, the nodes BLTI[0,0], . . . , BLTI[m−1,n−1] fall to a logic zero—since the transistor P1 of the supply voltage generation circuit 35 was turned off when CKINT went low, the current sinking requirement imposed on the write drivers 22 is reduced, and the write drivers 22 are able to sink sufficient current to overcome the current sourced by transistor P2 to the virtual supply voltage node VDDMA to thereby quickly pull BLTI[0,0], . . . , BLTI[m−1,n−1] to a logic low.

Notice, however, that as can be seen in FIG. 3, the voltage at the nodes BLFI[0,0], . . . , BLFI[m−1,n−1] rises slowly, and by time t5, that voltage has reached only around one half of the logic high value. This is because of the current starvation caused by the fact that transistor P1 is off; in order to charge nodes BLFI[0,0], . . . , BLFI[m−1,n−1], current is drawn from the virtual supply voltage node VDDMA, and due to transistor P1 being off, less current is available to be drawn.

At time t5, the internal clock signal CKINT rises back to a logic high, meaning that CKINT_B falls to a logic low and the transistor P1 is turned back on. Therefore, notice that beginning at time t5, nodes BLFI[0,0], . . . , BLFI[m−1,n−1] are quickly charged to a logic high; this occurs because, beginning at t5, more current is available to be drawn from the virtual supply voltage node VDDMA.

As stated, at time t5, the internal clock signal CKINT rises back to a logic high, which releases the latching of RST, so RST_Lat falls low. By time t6, the bit cells all hold a logic 0-nodes BLTI[0,0], . . . , BLTI[m−1,n−1] are at a logic low and nodes BLFI[0,0], . . . , BLFI[m−1,n−1] are at a logic high. Word lines WL[0], . . . , WL[n−1] are released and fall low, and at the same time, precharge is reinstated so the bit lines BL[0], . . . , BL[m−1] rise back to a logic high. Also, D_int rises back high and D_int_B falls low.

Note that instead of one write cycle (i.e., clock cycle) being performed per word in each row as would be performed with a traditional SRAM, only one write cycle total is performed in order to reset all columns of the rows 0, . . . , n−1.

Naturally, the above described techniques may be extended to any number of rows, and thus, where the memory array 12 of size m×n, all m columns of all n rows may be reset simultaneously, or all m columns of any number of rows may be reset simultaneously, or any number of columns of any number of rows may be reset simultaneously.

In the above example described with reference to FIG. 3, all rows and all columns of the memory array 12 were reset to 0. However, all rows and fewer than all columns may be reset, all columns and fewer than all rows may be reset, and fewer than all rows and fewer than all columns may be reset. This is controlled by the RST_Lat signal, which can be observed as being provided as input to both the column decoder 18*a* and the row decoder 18*b*. To effectuate this, only the word lines desired to be reset are asserted (simultaneously, as described above), and only the columns desired to be reset are selected. For example, the column decoder 18*a* and row decoder 18*b* may contain circuitry that, upon receipt of an asserted RST_Lat signal, selects certain desired columns and certain desired rows.

B. Fast Reset of Memory Cells to Logic 1

In the above example, desired rows and columns of the memory array 12 were reset to 0. However, in some applications, desired rows and columns of the memory array 12 may instead be reset to 1.

Figure 4:
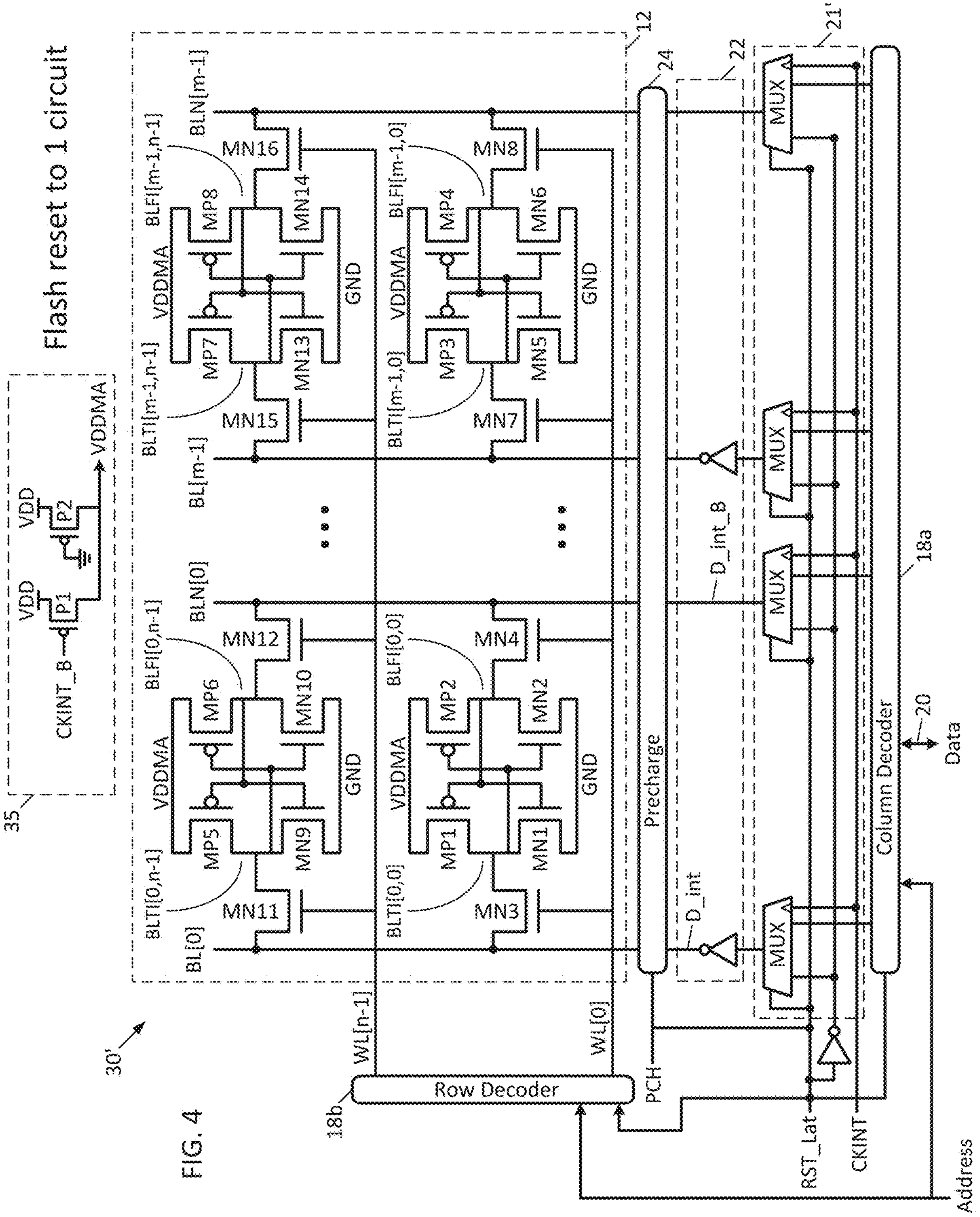
FIG. 4 is a schematic block diagram of a SRAM device disclosed herein which is capable of performing a fast and low-power reset to all rows and all columns of memory cells simultaneously to a value of 1, the SRAM device having the capability of limiting the current drawn during the reset operation.

Such an embodiment is shown in FIG. 4 and will now be described. The difference in the SRAM device 30' of FIG. 4 as opposed to the SRAM device 30 of FIG. 2, is that in the SRAM device 30' of FIG. 4, the data inputs of the multiplexers MUX in the multiplexing circuit 21' are coupled to a complement of RST_Lat as opposed to RST_Lat. This means that, referring now to FIG. 5, when the multiplexers are clocked by CKINT, D_int rises to a logic high and D_int_B falls to a logic low by time t3. This means that it is the complementary bit lines BLN[0], . . . , BLN[m−1] that fall to a logic low and the bit lines BL[0], . . . , BL[m−1] that remain at a logic high.

Since the bit lines BL[0], . . . , BL[m−1] are at a logic high and the complementary bit lines BLN[0], . . . , BLN[m−1] are at a logic low at this point, when word lines WL[0], . . . , WL[n−1] are asserted, nodes BLFI[0,0], . . . , BLFI[m−1,n−1] fall to a logic low-since the transistor P1 of the supply voltage generation circuit 35 was turned off when CKINT went low, the current sinking requirement imposed on the write drivers 22 is reduced, and the write drivers 22 are able to sink sufficient current to overcome the current sourced by transistor P2 to the virtual supply voltage node VDDMA to thereby quickly pull BLFI[0,0], . . . , BLFI[m−1,n−1] to a logic low.

Figure 5:
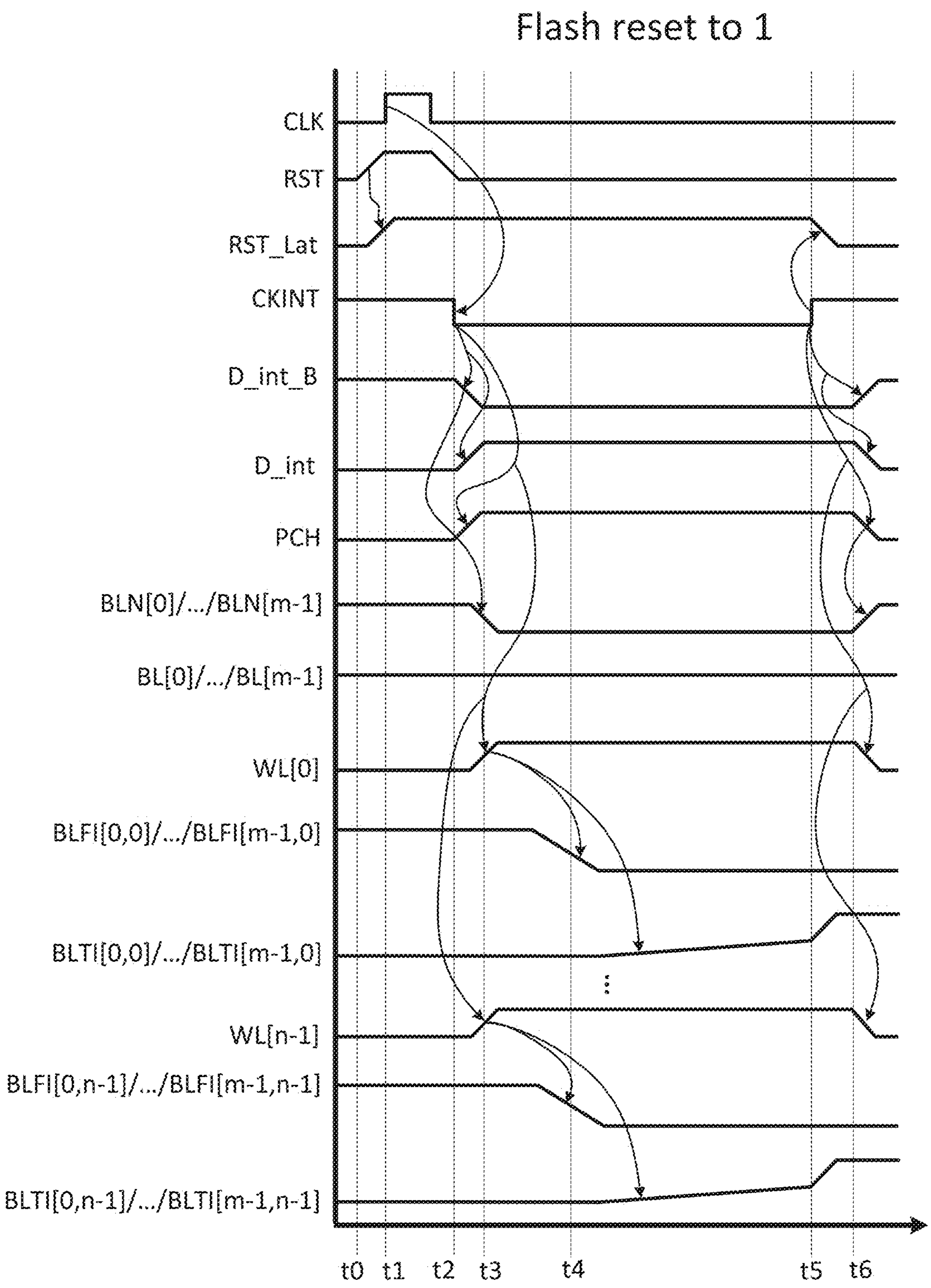
FIG. 5 is a timing diagram of the SRAM device of FIG. 4 when resetting all rows and all columns of memory cells to a default value of logic 1.

Notice, however, that as can be seen in FIG. 5, the voltage at the nodes BLTI[0,0], . . . , BLTI[m−1,n−1] rises slowly, and by time t5, that voltage has reached only around one half of the logic high value. This is because of the current starvation caused by the fact that transistor P1 is off; in order to charge nodes BLTI[0,0], . . . , BLTI[m−1,n−1], current is drawn from the virtual supply voltage node VDDMA, and due to transistor P1 being off, less current is available to be drawn.

At time t5, the internal clock signal CKINT rises back to a logic high, meaning that CKINT_B falls to a logic low and the transistor P1 is turned back on. Therefore, notice that beginning at time t5, nodes BLTI[0,0], . . . , BLTI[m−1,n−1] are quickly charged to a logic high; this occurs because, beginning at t5, more current is available to be drawn from the virtual supply voltage node VDDMA.

As stated, at time t5, the internal clock signal CKINT rises back to a logic high, which releases the latching of RST, so RST_Lat falls low. By time t6, the bit cells all hold a logic 1-nodes BLFI[0,0], . . . , BLFI[m−1,n−1] are at a logic low and nodes BLTI[0,0], . . . , BLFI[m−1,n−1] are at a logic high. Word lines WL[0], . . . , WL[n−1] are released and fall low, and at the same time, precharge is reinstated so the complementary bit lines BLN[0], . . . , BLN[m−1] rise back to a logic high. Also, D_int rises back high and D_int_B falls low.

In the above example, desired rows and columns of the memory array 12 were reset to 1. However, in some applications, it may be desired for the desired rows and columns of the memory array 12 to be reset into a pattern. For example, desired columns may be reset to a 0 while desired columns may be reset to a 1. The change here is that for the columns it is desired to be reset to a 1, the multiplexers associated with the bit lines and complementary bit lines of those columns have the arrangement shown in FIG. 4, but for the columns it is desired to be reset to 0, the multiplexers associated with those bit lines and complementary bit lines have the arrangement shown in FIG. 2.

C. Fast Corruption of Memory Cells

An unauthorized attempt at accessing the contents of the memory array 12 may be detected, and it may be desirable for some or all of the contents of the memory array 12 to be corrupted (i.e., lost, randomized, etc.) so that the unauthorized attempt does not retrieve the information that had been stored in the memory array 12.

Figure 6:
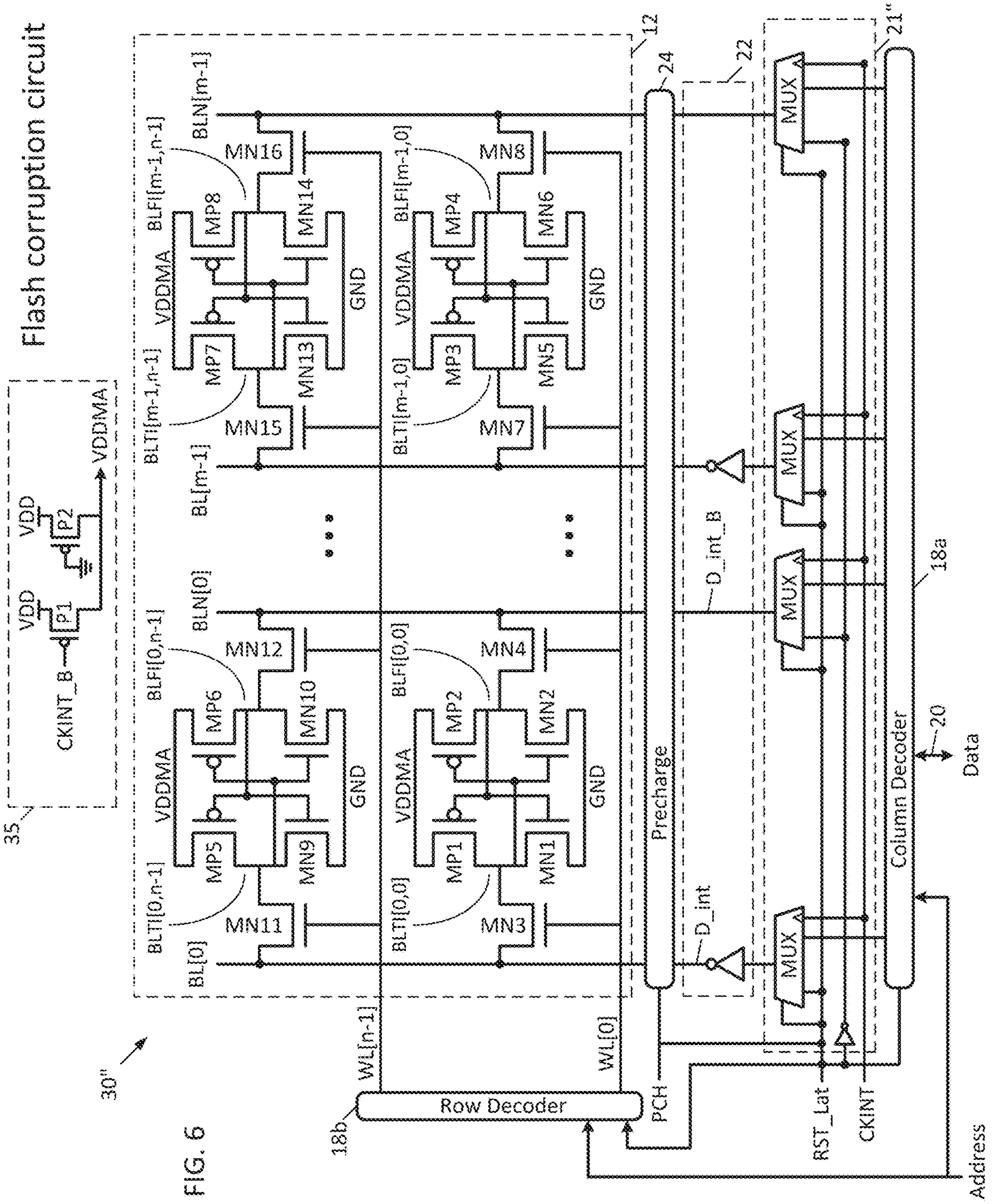
FIG. 6 is a schematic block diagram of a SRAM device disclosed herein which is capable of performing a quick corruption of the data stored in all rows and all columns of memory cells, the SRAM device having the capability of limiting the current drawn during the data corruption operation.

An example of a SRAM device 30" capable of performing such a corruption is now described with additional reference to FIG. 6.

The difference in the SRAM device 30" of FIG. 6 as opposed to the SRAM device 30 of FIG. 2 is that in the SRAM device 30" of FIG. 6, the data inputs of the multiplexers in the multiplexing circuit 21" associated with the bit lines BL[0], . . . , BL[m−1] are coupled to RST_Lat, but the data inputs of the multiplexers in the multiplexing circuit 21" associated with the complementary bit lines BLN[0], . . . , BLN[m−1] are coupled to a complement of RST_Lat as opposed to RST_Lat.

Figure 7:
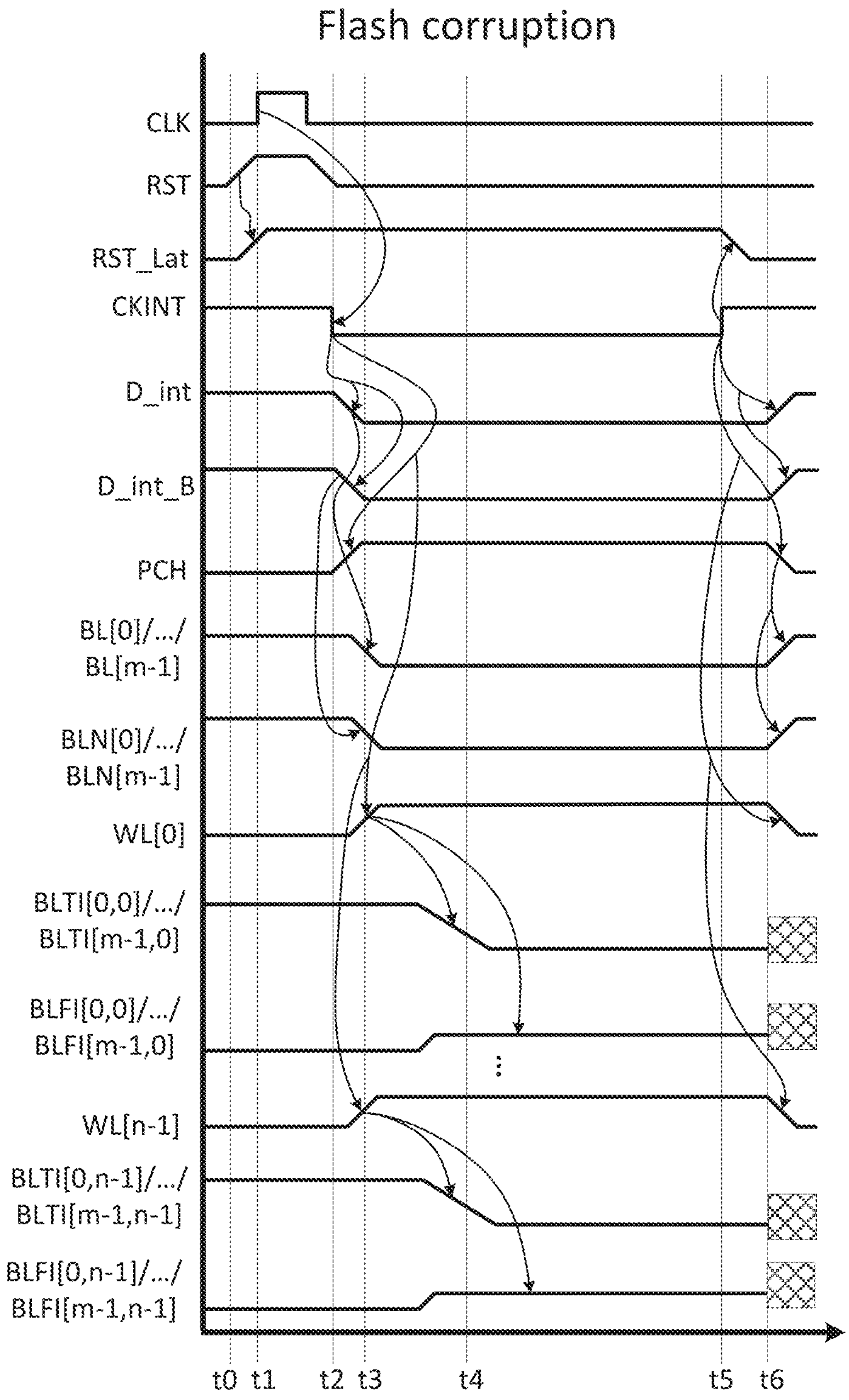
FIG. 7 is a timing diagram of the SRAM device of FIG. 6 when simultaneously corrupting the contents of all memory cells of the SRAM device.

Performance of the data corruption is now described with additional reference to FIG. 7.

Assume here that an unauthorized attempt at accessing the memory array 12 has been detected, and it is desired to corrupt the data stored in all n rows of the memory array 12. To perform such a data corruption, when the unauthorized attempt is detected, the signal RST (from a pin or pad) is asserted, illustrated at time t0. This reset signal RST is latched by time t1 to generate a latched version RST_LAT of the reset signal RST. At time t2, an internal clock signal CKINT generated based upon the external clock signal CLK falls to a logic low. CKINT falling to a logic low means that its complement, CKINT_B, rises to a logic high, turning off transistor P1, thereby limiting the supply of current to the memory array 12.

Also at time t2, as a result of CKINT falling to a logic low, precharge is released, and the multiplexers of the multiplexing circuitry 21" are clocked. As a result of the clocking of the multiplexers, the multiplexers select which data input is to be passed to their output, based upon the signal at their selection input. The multiplexers are arranged such that RST_Lat being at a logic high, for those multiplexers associated with the bit lines BL[0], . . . , BL[m−1], selects the data inputs of those multiplexers that are coupled to RST_Lat, and for those multiplexers associated with the complementary bit lines BLN[0], . . . , BL[m−1] selects the data inputs of those multiplexers that are coupled to the complement of RST_Lat. As a result, by time t3, the output of the multiplexers associated with the bit lines BL[0], . . . , BL[m−1] has risen to a logic high, and the output of the multiplexers associated with the complementary bit lines BLN[0], . . . , BLN[m−1] has fallen to a logic low.

Due to the inverters coupled between the multiplexers and the precharge circuitry 24 for the bit lines BL[0], . . . , BL[m−1], the signal D_int is forced onto the bit lines BL[0], . . . , BL[m−1], which fall to a logic low. Due to the lack of inverters coupled between the multiplexers and the precharge circuitry for the complementary bit lines BLN[0], . . . , BLN[m−1], the signal D_int_B is forced onto the complementary bit lines BLN[0], . . . , BLN[m−1], which also fall to a logic low.

Also as a result of CKINT falling to a logic low, the word lines WL[0], . . . , WL[n−1] are asserted, turning on the pass gate transistors within each bit cell (e.g., for the illustrated bit cells, MN3, MN4 within C[0,0]; MN7, MN8 within C[m−1,0]; M11, M12 within C[0,n−1]; and M15, M15 within C[m−1,n−1]). When the word lines WL[0], . . . , WL[n−1] are asserted, the write drivers 22 attempt to pull the nodes BLTI[0,0], . . . , BLTI[m−1,n−1] to a logic low.

In order to pull the nodes BLTI[0,0], . . . , BLTI[m−1,n−1] to a logic low, the write drivers 22 must have sufficient current sinking ability to pull those nodes to a logic low simultaneously. Stated another way, in order to pull all the nodes BLTI[0,0], . . . , BLTI[m−1,n−1] to a logic low simultaneously, the current sinking ability of the write drivers 22 must be sufficient to overcome the amount of current that is sourced to node VDDMA. Here, with the SRAM device 30", the turning off of transistor P1 that occurs when the internal clock signal transitions low reduces the amount of current that can be sourced to node VDDMA, reducing the requisite current sinking ability of the write drivers 22 to pull all the nodes BLTI[0,0], . . . , BLTI[m−1,n−1] to a logic low simultaneously, thereby enabling the write drivers 22 to pull all the nodes BLTI[0,0], . . . , BLTI[m−1,n−1] to (nearly) a logic low, as will be explained below. Therefore, the turning off of transistor P1 enables the ability to corrupt large numbers of rows, or even all rows, simultaneously.

Since the PMOS transistors that have their drains connected to nodes BLFI[0,0], . . . , BLFI[m−1,n−1] have their gates connected to nodes BLTI[0,0], . . . , BLTI[m−1,n−1], the result of current being sunk from nodes BLTI[0,0], . . . , BLTI[m−1,n−1] is to turn on those transistors, which in turn causes the voltage at nodes BLFI[0,0], . . . , BLFI[m−1,n−1] to rise to slightly above ground by time t4, as shown in FIG. 7. The reason that the voltage at nodes BLFI[0,0], . . . , BLFI[m−1,n−1] rises to slightly above ground at this point (instead of rising to a logic high) is because the write drivers 22 are also attempting to pull the nodes BLFI[0,0], . . . , BLFI[m−1,n−1] to a logic low by sinking current from nodes BLFI[0,0], . . . , BLFI[m−1,n−1].

Also note that the current being sunk from nodes BLFI[0,0], . . . , BLFI[m−1,n−1] results in the PMOS transistors that have their gates connected to nodes BLFI[0,0], . . . , BLFI[m−1,n−1] turning on, which in turn causes the voltage at nodes BLTI[0,0], . . . , BLTI[m−1,n−1] to be unable to be pulled fully to ground, as also shown in FIG. 7.

By time t5, the inverters of all memory cells C[0,0], . . . , C[m−1,n−1] have a voltage near (but not at) a logic low at their input, and the internal clock signal CKINT rises back to a logic high, which releases the latching of RST, so RST_Lat falls low. By time to the word lines WL[0], . . . , WL[n−1] are released and fall low, and at the same time, precharge is reinstated so the bit lines BL[0], . . . , BL[m−1] rise back to a logic high. Also, D_int and D_int_B rise back high.

When the word lines WL[0], . . . , WL[m−1] are released at time t6, the memory cells C[0,0], . . . , C[m−1,n−1] thus enter into a metastable state, since each memory cell is comprised of two cross coupled inverters and two cross coupled inverters cannot each have the same output. This means that one of the inverters in each metastable memory cell will "win" (i.e., its output will remain the same and result in the output of the other inverter flipping), but it cannot be predicted or known which inverter will "win". Thus, the data state of each affected memory cell becomes randomized, and therefore the contents of the corrupted memory cells are randomized, meaning that if the unauthorized attempt proceeds and is successful, the data it retrieves will be useless random data.

Naturally, the above described techniques may be extended to any number of rows, and thus, where the memory array 12 of size m×n, all m columns of all n rows may be reset simultaneously.

In the above example described with reference to FIG. 6, all rows and all columns of the memory array 12 had their data corrupted. However, all rows and fewer than all columns may have their data corrupted, all columns and fewer than all rows may have their data corrupted, and fewer than all rows and fewer than all columns may have their data corrupted. This is controlled by the RST_Lat signal, which can be observed as being provided as input to both the column decoder 18*a* and the row decoder 18*b*. To effectuate this, only the word lines containing data desired to be corrupted are asserted (simultaneously, as described above), and only the columns containing data desired to be corrupted are selected.

Also note that while in the example above, the bit lines BL[0], . . . , BL[m−1] and complementary bit lines BLN[0], . . . , BL[m−1] are forced to 0 prior to the desired word lines being asserted so as to perform the data corruption, they may instead all be forced to 1. As another alternative, the bit lines and complementary bit lines of one column may be forced to 0 while the bit lines and complementary bit lines of another column are forced to 1. Indeed, the data corruption may be performed for any column in which its bit line and complementary bit line are forced to the same value prior to word line assertion.

This functionality described above allows a quick corruption of the data of desired rows and columns in a single write operation (i.e., clock cycle).

All techniques described in sections A, B, and C of this disclosure above apply to self-timed SRAM memories as well as non-self timed SRAM memories.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A method of corrupting contents of a memory array, comprising:

a) asserting a signal at a reset node to thereby cause starving of current supply to the memory array;

b) selecting bit lines and complementary bit lines associated with desired columns of the memory array that contain memory cells to have their contents corrupted;

c) for each desired column, forcing a logic state of its bit line and complementary bit line to a same logic state; and d) simultaneously asserting each word line associated with desired rows of the memory array that contains memory cells to have their contents corrupted, and then simultaneously deasserting those word lines to thereby place each memory cell to have its contents corrupted into a metastable state during a single clock cycle.

2. The method of claim 1, further comprising:

generating a virtual supply voltage from a power supply voltage by coupling a power supply voltage node to a virtual supply voltage node using multiple transistors to thereby generate the virtual supply voltage at the virtual supply voltage node; and powering the memory array using the virtual supply voltage;

wherein asserting the signal at the reset node causes starving of the current supply to the memory array by turning off one of the multiple transistors being used to couple the power supply voltage node to the virtual supply voltage node.

3. The method of claim 2, wherein the one of the multiple transistors turned off to starve the current supply to the memory array is a largest of the multiple transistors.

4. The method of claim 1, wherein all memory cells of the memory array are desired to have their contents corrupted;

wherein b) comprises selecting all bit lines and all complementary bit lines;

wherein c) comprises, for each column, forcing a logic state of its bit line and complementary bit line to a same logic state; and wherein d) comprises simultaneously asserting each word line, and then simultaneously deasserting each word line.

5. The method of claim 4, wherein c) comprises, for each column, forcing a logic state of its bit line and complementary bit line to a given logic state.

6. The method of claim 1, wherein less than all columns contain memory cells that are desired to have their contents corrupted, or less than all rows contain memory cells that are desired to have their contents corrupted.

7. The method of claim 1, wherein b), c), and d) are performed in response to a clock pulse of an internal clock signal, with the deasserting of the word lines being performed at an end of the clock pulse.

8. The method of claim 1, wherein the signal at the reset node is a complement of an internal clock signal.

9. The method of claim 1, wherein placing each memory cell into the metastable state comprises:

causing voltage levels at first nodes of the memory cells to be pulled to near but not fully at a first logic level; and causing voltage levels at second nodes of the memory cells to rise to slightly above a second logic level.

10. The method of claim 1, wherein after placing each memory cell into the metastable state, a final logic state of each memory cell is randomly determined based on which of its cross-coupled inverters prevails in resolution of the metastable state.

11. The method of claim 1, wherein forcing the logic state of bit lines and complementary bit lines to the same logic state comprises:

for a first subset of the desired columns, forcing both the bit line and complementary bit line to a logic low state; and for a second subset of the desired columns, forcing both the bit line and complementary bit line to a logic high state.

12. A static random access memory (SRAM) device, comprising:

a virtual power supply circuit configured to generate a virtual power supply voltage;

a memory array powered between the virtual power supply voltage and a reference voltage, the memory array being comprised of memory cells and being organized into rows and columns, with each row having a word line associated therewith and each column having a bit line and complementary bit line associated therewith;

a row decoder configured to selectively assert word lines of desired rows;

a column decoder configured to select desired columns;

wherein the virtual power supply circuit is configured to reduce its current output so as to starve the memory array in response to an internal clock signal pulse; and column driving circuitry configured to, in response to being clocked by the internal clock signal pulse and assertion of a latched reset signal, drive the bit lines and the complementary bit lines of the desired columns to a same logic state;

wherein, in response to being clocked by the internal clock signal pulse and based upon the latched reset signal, the row decoder simultaneously asserts the word lines of each desired row; and wherein, in response to an end of the internal clock signal pulse, the row decoder simultaneously deasserts the word lines of each desired row, thereby placing the memory cells belonging to the desired rows and the desired columns into a metastable state.

13. The SRAM device of claim 12, wherein the virtual power supply circuit comprises:

at least one first transistor coupled to a power supply voltage and configured to output the virtual power supply voltage when on; and at least one second transistor coupled to the power supply voltage and configured to contribute to outputting the virtual power supply voltage when on;

wherein the at least one second transistor is configured to turn off in response to receipt of the internal clock signal pulse to thereby reduce current output by the virtual power supply circuit to the memory array.

14. The SRAM device of claim 13, wherein the at least one second transistor is larger than the at least one first transistor.

15. The SRAM device of claim 13, wherein the column driving circuitry comprises:

an inverter associated with each different bit line, that inverter having its output coupled to that bit line; and a multiplexing circuit comprising:

a different first multiplexer respectively associated with each different bit line; and a different second multiplexer respectively associated with each different complementary bit line;

wherein each first multiplexer has a first data input coupled to the latched reset signal, a second data input coupled to the column decoder, a selection input coupled to the latched reset signal, and a clock input coupled to receive the internal clock signal pulse;

wherein each second multiplexer has a first data input coupled to a complement of the latched reset signal, a second data input coupled to the column decoder, a selection input coupled to the latched reset signal, and a clock input coupled to receive the internal clock signal pulse; and wherein, in response to being clocked by the internal clock signal pulse and assertion of the latched reset signal, each first multiplexer and each second multiplexer of each selected column passes its first data input as output, thereby driving the bit lines and the complementary bit lines of the desired columns to a same logic state.

16. The SRAM device of claim 15, wherein:

the latched reset signal is generated from a reset signal received at a reset node of the SRAM device; and the latched reset signal is provided to the row decoder to enable selection of the desired rows and to the column decoder to enable selection of the desired columns.

17. The SRAM device of claim 12, wherein each memory cell comprises:

a first inverter having an input coupled to a first node and an output coupled to a second node;

a second inverter having an input coupled to the second node and an output coupled to the first node;

a first transfer gate coupling the first node to the bit line; and a second transfer gate coupling the second node to the complementary bit line;

wherein the metastable state comprises both the first and second nodes being at voltage levels near but not equal to a same logic level.

18. The SRAM device of claim 12, wherein the column driving circuitry is configured such that when driving the bit lines and complementary bit lines to the same logic state:

write drivers have sufficient current sinking capability to pull nodes of the memory cells to near but not fully at a target logic level when the virtual power supply circuit has reduced its current output; and the write drivers have insufficient current sinking capability to fully pull the nodes to the target logic level.

* * * * *